(12) United States Patent
Kang (10) Patent No.: US 11,195,564 B2
(45) Date of Patent: Dec. 7, 2021

(54) DRAM DATA LINE SWITCHING CONTROL CIRCUIT AND MINIMIZING NUMBER OF DATA LINE SWITCHES FOR POWER REDUCTION

(71) Applicant: SK hynix Inc., Icheon-si (KR)

(72) Inventor: Kyeong Pil Kang, Hwaseong-si (KR)

(73) Assignee: SK hynix Inc., Icheon-si (KR)

( * ) Notice: Subject to any disclaimer, the term of this patent is extended or adjusted under 35 U.S.C. 154(b) by 0 days.

(21) Appl. No.: 16/808,228

(22) Filed: Mar. 3, 2020

(65) Prior Publication Data

US 2021/0035616 A1   Feb. 4, 2021

(30) Foreign Application Priority Data

Aug. 1, 2019   (KR) .................. 10-2019-0093711

(51) Int. Cl.

| G11C 7/12 | (2006.01) |
|---|---|
| G11C 7/10 | (2006.01) |
| G11C 7/22 | (2006.01) |
| G11C 11/4091 | (2006.01) |
| G11C 11/4093 | (2006.01) |
| G11C 11/4094 | (2006.01) |
| G11C 11/4076 | (2006.01) |
| G11C 11/4096 | (2006.01) |
| G11C 7/06 | (2006.01) |

(52) U.S. Cl.
CPC .......... *G11C 7/1006* (2013.01); *G11C 7/1048* (2013.01); *G11C 7/12* (2013.01); *G11C 7/222* (2013.01); *G11C 11/4076* (2013.01); *G11C 11/4091* (2013.01); *G11C 11/4093* (2013.01); *G11C 11/4094* (2013.01); *G11C 11/4096* (2013.01); *G11C 7/06* (2013.01); *G11C 2207/002* (2013.01); *G11C 2207/005* (2013.01)

(58) Field of Classification Search
CPC .............. G11C 7/1006; G11C 11/4094; G11C 11/4093; G11C 11/4091; G11C 7/12; G11C 7/222; G11C 7/06
See application file for complete search history.

(56) References Cited

U.S. PATENT DOCUMENTS

| 5,689,461 A * | 11/1997 | Kaneko .................. G11C 5/145 365/189.07 |
|---|---|---|
| 7,280,422 B2 | 10/2007 | Kim et al. |

(Continued)

*Primary Examiner* — Mushfique Siddique
(74) *Attorney, Agent, or Firm* — William Park & Associates Ltd.

(57) ABSTRACT

A semiconductor device includes a memory cell array, a first pre-charge circuit, and a data line switching control circuit. The memory cell array includes a first data line, a second data line, and a third data line. The first pre-charge circuit is configured to pre-charge the first data line according to a first voltage level of a first equalizing signal. The data line switching control circuit is configured to disconnect the second data line from the third data line according to a second voltage level of a data line switching control signal in a standby operation of the semiconductor device, to perform charge sharing of the first equalizing signal and the data line switching control signal for a first time in an active operation of the semiconductor device, and to drive the data line switching control signal to the first voltage level.

19 Claims, 7 Drawing Sheets

(56) References Cited

U.S. PATENT DOCUMENTS

| | | | | |
|---|---|---|---|---|
| 2002/0001215 A1* | 1/2002 | Fujisawa | ............... | G11C 5/025 |
| | | | | 365/51 |
| 2005/0237833 A1* | 10/2005 | Byeon | ...................... | G11C 7/06 |
| | | | | 365/203 |
| 2011/0103123 A1* | 5/2011 | Nakaoka | ............ | G11C 11/4091 |
| | | | | 365/63 |
| 2011/0176379 A1* | 7/2011 | Takayama | ........... | G11C 11/4097 |
| | | | | 365/208 |

* cited by examiner

DRAM DATA LINE SWITCHING CONTROL CIRCUIT AND MINIMIZING NUMBER OF DATA LINE SWITCHES FOR POWER REDUCTION

CROSS-REFERENCES TO RELATED APPLICATION

The present application claims priority under 35 U.S.C. § 119(a) to Korean application number 10-2019-0093711, filed on Aug. 1, 2019, in the Korean Intellectual Property Office, which is incorporated herein by reference in its entirety.

BACKGROUND

1. Technical Field

Various embodiments may generally relate to a semiconductor circuit, and more particularly, to a data line switching control circuit and a semiconductor device including the same.

2. Related Art

A semiconductor device may include a plurality of data lines for writing data in a memory region and for reading data from the memory region to an external device.

The semiconductor device may also include a plurality of input/output switches (hereinafter, referred to as switches). The switches may function to connect the data lines with each other for transmitting the data during write and read operations. In contrast, the switches may function to disconnect the data lines from each other for preventing the transmission of the data between the data lines.

In order to input/output large quantities of data, the number of data lines may be increased. Thus, the number of the switches may also be increased in proportion to the number of data lines.

In order to control the switches, that is, turn-on or turn-off the switches, current is consumed. Thus, the consumption current is increased in proportion to the number of switches.

According to related arts, a great amount of current may be consumed to control the switches. Particularly, the consumption current may be an important factor for determining the capacity of a semiconductor device used in a mobile device.

SUMMARY

In example embodiments of the present disclosure, a data line switching control circuit may include a first driver, a second driver, and a charge control switch. The first driver is configured to generate a first equalizing signal for pre-charging a first data line in accordance with a source equalizing signal through a first signal line. The second drive is configured to generate a data line switching control signal for connecting a second data line with a third data line in accordance with a source switching control signal through a second signal line. The charge control switch is configured to connect the first signal line with the second signal line in accordance with a charge control signal.

In example embodiments of the present disclosure, a semiconductor device may include a memory cell array, a first pre-charge circuit, and a data line switching control circuit. The memory cell array may include a first data line, a second data line, and a third data line. The first pre-charge circuit is configured to pre-charge the first data line in accordance with a first voltage level of a first equalizing signal. The data line switching control circuit is configured to disconnect the second data line from the third data line in accordance with a second voltage level of a data line switching control signal in a standby operation of the semiconductor device. The data line switching control circuit is also configured to perform charge sharing of the first equalizing signal and the data line switching control signal for a first time in an active operation of the semiconductor device. The data line switching control circuit is further configured to drive the data line switching control signal to the first voltage level.

BRIEF DESCRIPTION OF THE DRAWINGS

The above and another aspects, features, and advantages of the subject matter of the present disclosure will be more clearly understood from the following detailed description taken in conjunction with the accompanying drawings, in which.

DETAILED DESCRIPTION

Various embodiments of the present teachings are described in greater detail with reference to the accompanying drawings. The drawings are schematic illustrations of various embodiments (and intermediate structures). As such, variations from the configurations and shapes of the illustrations as a result, for example, of manufacturing techniques and/or tolerances, are to be expected. Thus, the described embodiments should not be construed as being limited to the particular configurations and shapes illustrated herein but may include deviations in configurations and shapes which do not depart from the spirit and scope of the present teachings as defined in the appended claims.

The present teachings are described herein with reference to cross-section and/or plan illustrations of a number of embodiments. However, described embodiments of the present teachings should not be construed as limiting the inventive concept. Although a limited number of possible embodiments of the present teachings are shown and described, it will be appreciated by those of ordinary skill in the art that changes may be made in these embodiments without departing from the principles and spirit of the present teachings as set forth in the appended claims.

Various embodiments provide a data line switching control circuit that may be capable of reducing a current for controlling input/output switches. A number of embodiments also provide a semiconductor device including the above-mentioned data line switching control circuit. Thus, a current consumed for controlling the input/output switches may be reduced to decrease a consumption current of the semiconductor device.

Figure 1:
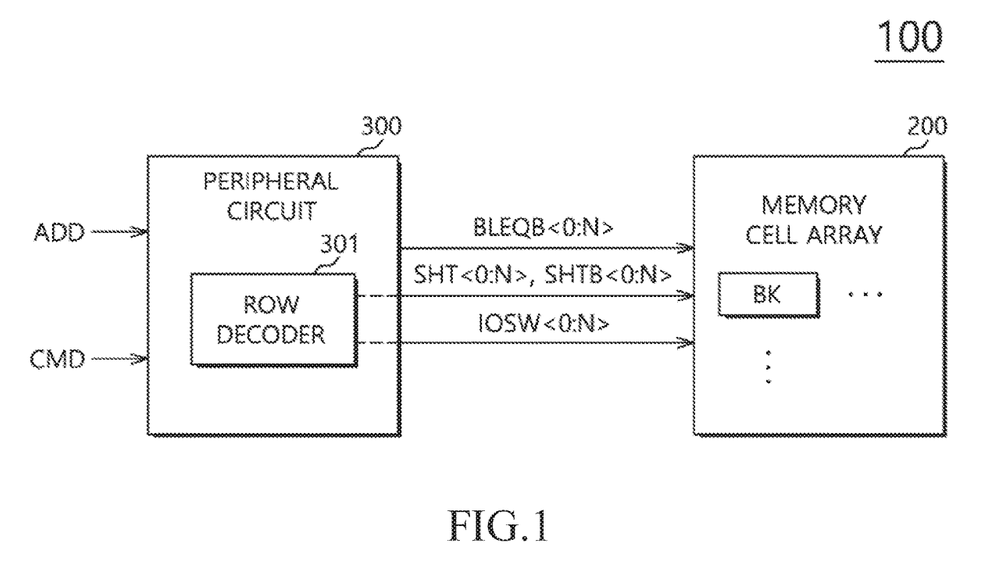
FIG. 1 is a view illustrating a semiconductor device in accordance with example embodiments.

FIG. 1 is a view illustrating a semiconductor device 100 in accordance with example embodiments.

Referring to FIG. 1, the semiconductor device 100 may include a memory cell array 200 and a peripheral circuit 300.

Although not depicted in drawings, the memory cell array 200 may include a plurality of memory cells, a plurality of word line, a plurality of bit lines, a plurality of segment lines, and a plurality of local lines connected with the memory cells.

The memory cell array 200 may be divided into a plurality of regions. Each of the regions may be divided into a plurality of sub-regions.

For example, a region may be referred to as a memory bank BK. A sub-region may be referred to as a MAT.

Control circuits may be integrated in the peripheral circuit 300. The control circuits may generate various control signals related to a write operation for writing data in the memory cell array 200 and a read operation for reading data from the memory cell array 200 in accordance with a command CMD and an address signal ADD.

The control signals may include a plurality of source equalizing signals BLEQB<0:N>, a plurality of data line switching control signals IOSW<0:N>, and a plurality of charge control signals SHT<0:N>/SHTB<0:N>.

The peripheral circuit 300 may include a row decoder 301 as the control circuits. The row decoder 301 may selectively activate the word lines in accordance with the address signal ADD.

The row decoder 301 may generate the data line switching control signals IOSW<0:N> and the charge control signals SHT<0:N>/SHTB<0:N>.

The row decoder 301 may obtain information for activating any one of the regions of the memory cell array 200 and any one of the sub-regions in the activated region.

The row decoder 301 may select at least one of the data line switching control signals IOSW<0:N> and at least one of the charge control signals SHT<0:N>/SHTB<0:N>, which are to be activated, using the information obtained by the address ADD.

In example embodiments, the data line switching control signals IOSW<0:N> and the charge control signals SHT<0:N>/SHTB<0:N> may be generated from the row decoder 301. Alternatively, the data line switching control signals IOSW<0:N> and the charge control signals SHT<0:N>/SHTB<0:N> may be generated from other elements in the peripheral circuit 300.

Figure 2:
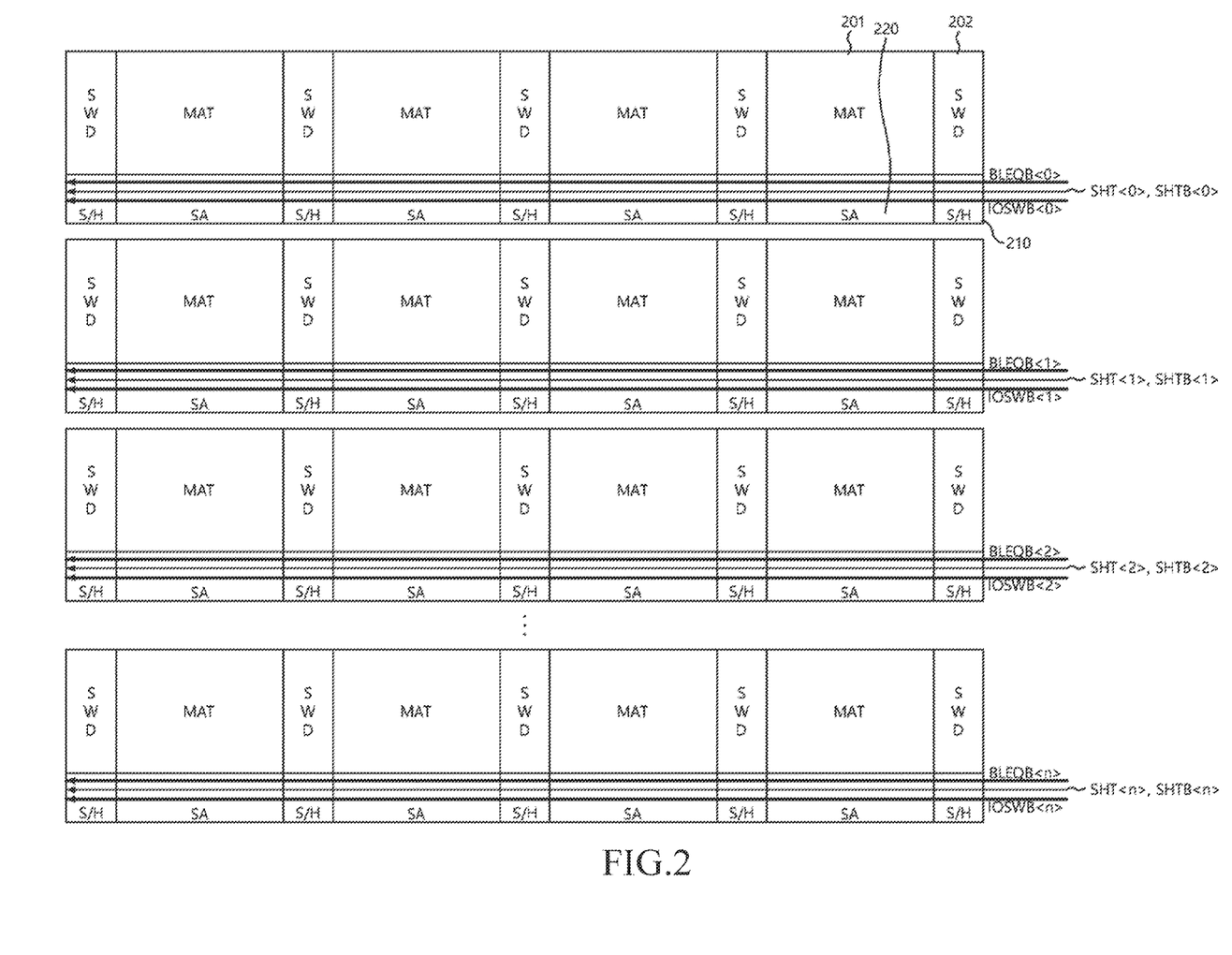
FIG. 2 is a view illustrating a memory bank in FIG. 1.

FIG. 2 is a view illustrating a memory bank BK in FIG. 1.

Referring to FIG. 2, the memory bank BK may include a plurality of the MATs 201, a plurality of sub-word line driver regions SWD 202, a plurality of sub-hole regions S/H 210, and a plurality of sense amplifier regions SA 220.

The sub-word line driver regions 202 may include driver circuits for driving sub-word lines connected to the word lines.

The source switching control signals ISOWB<0:N> may be provided to the sense amplifier regions 220.

The source equalizing signals BLEQB<0:N> and the charge control signals SHT<0:N>/SHTB<0:N> may be provided to the sub-hole regions 210.

Figure 3:
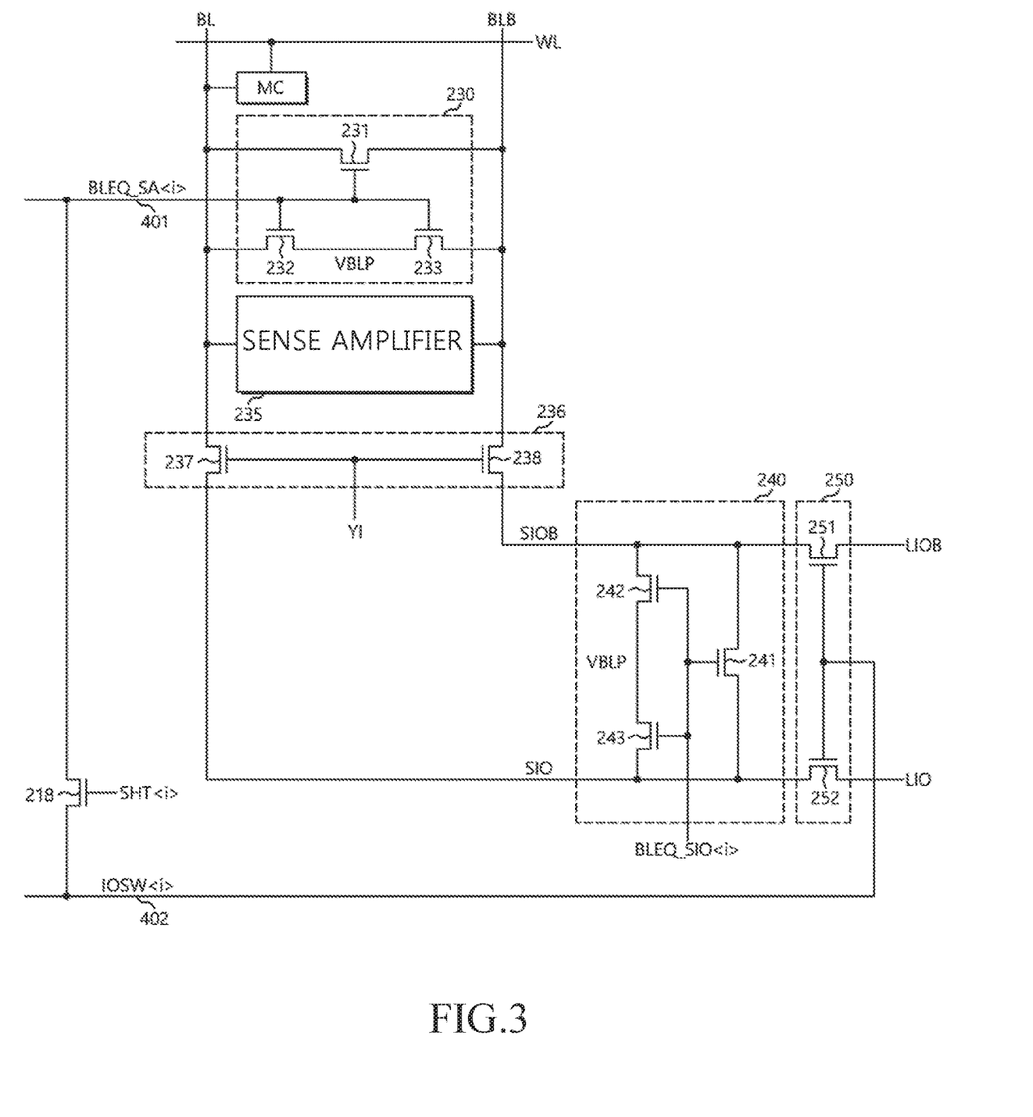
FIG. 3 is a view illustrating a connection between a data line and a charge control switch of a memory bank.

FIG. 3 is a view illustrating a connection between a data line of a memory bank and a charge control switch.

Referring to FIG. 3, a memory cell MC may be connected to one of a pair of first data lines and to a word line WL. Here, the pair of first data lines may include a pair of bit lines BL and BLB being referred to as a bit bar line.

A first pre-charge circuit 230 and a sense amplifier 235 may be connected between the pair of bit lines BL and BLB.

A column switching circuit 236 may be connected between the pair of bit lines BL and BLB and a pair of second data lines, for example, a pair of segment lines SIO and SIOB.

A second pre-charge circuit 240 may be connected between the pair of segment lines SIO and SIOB. Here, SIO may be referred to as the segment line and SIOB may be referred to as a segment bar line.

A data line switching circuit 250 may be connected between the pair of segment lines SIO and SIOB and a pair of third data lines, for example, a pair of local lines LIO and LIOB.

A charge control switch 218 may be connected between a first signal line 401 and a second signal line 402.

A sense amplifier equalizing signal BLEQ_SA<i> may be provided to the first pre-charge circuit 230 by the first signal line 401.

A data line switching control signal IOSW<i> may be provided to the data line switching circuit 250 by the second signal line 402.

The first pre-charge circuit 230, the sense amplifier 235, the column switching circuit 236, the second pre-charge circuit 240, and the data line switching circuit 250 may be included in the sense amplifier region 220 in FIG. 2.

The charge control switch 218 may be arranged to the sub-hole region 210.

The first pre-charge circuit 230 may pre-charge the pair of bit lines BL and BLB to a pre-charge voltage VBLP level in accordance with a first equalizing signal, for example, the sense amplifier equalizing signal BLEQ_SA<i>.

The first pre-charge circuit 230 may include a first transistor 231, a second transistor 232 and a third transistor 233.

The first transistor 231 may include a source and a drain. The bit line BL may be connected to any one of the source and the drain in the first transistor 231. The bit bar line BLB may be connected to the remaining one of the source and the drain in the first transistor 231.

The second transistor 232 may include a source and a drain. The bit line BL may be connected to any one of the source and the drain in the second transistor 232. The remaining one of the source and the drain in the second transistor 232 may receive the pre-charge voltage VBLP.

The third transistor 233 may include a source and a drain. The bit line BL may be connected to any one of the source and the drain in the third transistor 233. The remaining one of the source and the drain in the third transistor 233 may receive the pre-charge voltage VBLP.

The sense amplifier equalizing signal BLEQ_SA<i> may be commonly inputted to gates of the first to third transistors 231, 232, and 233.

The sense amplifier 235 may be connected between the bit line BL and the bit bar line BLB. The sense amplifier 23 may sense and amplify a voltage difference between the pair of bit lines BL and BLB.

The column switching circuit 236 may connect the pair of bit lines BL and BLB with the pair of segment lines SIO and SIOB in accordance with a column selection signal YI.

The column switching circuit 236 may include a first transistor 237 and a second transistor 238.

The first transistor 237 may include a source, a drain, and a gate. The bit line BL may be connected to any one of the source and the drain in the first transistor 237. The segment line SIO may be connected to the remaining one of the source and the drain in the first transistor 237. The column selection signal YI may be inputted to the gate of the first transistor 237.

The second transistor 238 may include a source, a drain, and a gate. The bit bar line BLB may be connected to any one of the source and the drain in the second transistor 238. The segment bar line SIOB may be connected to the remaining one of the source and the drain in the second transistor 238. The column selection signal YI may be inputted to the gate of the second transistor 238.

The second pre-charge circuit 240 may pre-charge the pair of segment lines SIO and SIOB to a pre-charge voltage VBLP level in accordance with a second equalizing signal, for example, the data line equalizing signal BLEQ_SIO<i>.

The second pre-charge circuit 240 may include a first transistor 241, a second transistor 242, and a third transistor 243.

The first transistor 241 may include a source and a drain. The segment line SIO may be connected to any one of the source and the drain in the first transistor 241. The segment bar line SIOB may be connected to the remaining one of the source and the drain in the first transistor 241.

The second transistor 242 may include a source and a drain. The segment bar line SIOB may be connected to any one of the source and the drain in the second transistor 242. The remaining one of the source and the drain in the second transistor 242 may receive the pre-charge voltage VBLP.

The third transistor 243 may include a source and a drain. The segment line SIO may be connected to any one of the source and the drain in the third transistor 243. The remaining one of the source and the drain in the third transistor 243 may receive the pre-charge voltage VBLP.

The data line equalizing signal BLEQ_SIO<i> may be commonly inputted to gates of the first to third transistors 241, 242, and 243.

The data line switching circuit 250 may connect the pair of pair of the segment lines SIO and SIOB with the pair of local lines LIO and LIOB or disconnect the pair of segment lines SIO and SIOB from the pair of local lines LIO and LIOB in accordance with the data line switching control signal IOSW<i>.

The data line switching circuit 250 may include a first transistor 251 and a second transistor 252.

The first transistor 251 may include a source and a drain. The segment bar line SIOB may be connected to any one of the source and the drain in the first transistor 251. The local bar line LIOB may be connected to the remaining one of the source and the drain in the first transistor 251.

The second transistor 252 may include a source and a drain. The segment line SIO may be connected to any one of the source and the drain in the second transistor 252. The local line LIO may be connected to the remaining one of the source and the drain in the second transistor 252.

The data line switching control signal IOSW<i> may be commonly inputted to gates of the first and second transistors 251 and 252.

The charge control switch 218 may be connected between the first signal line 401 and the second signal line 402 in accordance with a charge control signal SHT<i>.

The charge sharing between the sense amplifier equalizing signal BLEQ_SA<i> and the data line switching control signal IOSW<i> may be performed by the connection between the first signal line 401 and the second signal line 402.

A charge in the first signal line charged by the pre-charging operation may be charged in the second signal line 402 by the charge sharing operation. Thus, a voltage level of the data line switching control signal IOSW<i> can increase. Operations of the data line switching control using the charge control switch 218 may be illustrated later.

Figure 4:
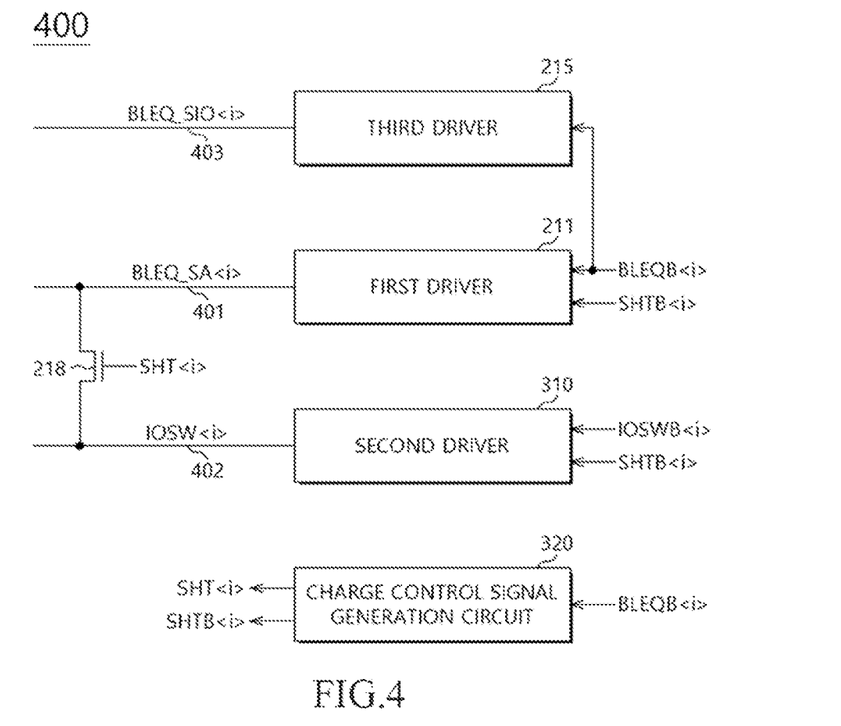
FIG. 4 is a view illustrating a data line switching control circuit in accordance with example embodiments.

FIG. 4 is a view illustrating a data line switching control circuit 400 in accordance with example embodiments.

FIG. 4 shows one signal IOSWB<i> of the source switching control signals IOSWB<0:N>, one signal BLEQB<i> of the source equalizing signals BLEQB<0:N>, and signals SHT<i> and SHTB<i> of the charge control signals SHT<0:N>/SHTB<0:N>.

Referring to FIG. 4, the data line switching control circuit 400 may include a first driver 211, a second driver 310, a third driver 215, a charge control signal generation circuit 320, and a charge control switch 218.

The first driver 211, the third driver 215, and the charge control switch 218 may be included in the sub-hole region 210 in FIG. 2.

The second driver 310 may be included in the row decoder 301 in FIG. 1.

The first driver 211 may drive the first signal line 401 for outputting the sense amplifier equalizing signal BLEQ_SA<i> to a first power voltage V1 or a ground voltage VSS level in accordance with any one SHTB<i> of the source equalizing signal BLEQB<i> and the pair of charge control signals SHT<i>/SHTB<i>.

The second driver 310 may drive the second signal line 402 for outputting the data line switching control signal IOSW<i> to a second power voltage V2 or the ground voltage VSS level in accordance with the source switching control signal IOSWB<i> and the charge control signals SHTB<0:N>.

The third driver 215 may drive the third signal line 403 for outputting the data line equalizing signal BLEQ_SIO<i> to the first power voltage V1 or the ground voltage VSS level in accordance with the source equalizing signal BLEQB<i>.

The charge control signal generation circuit 320 may generate the charge control signals SHT<i>/SHTB<i> in accordance with the source equalizing signal BLEQB<i>, the source switching control signal IOSWB<i>, and a reset signal RST.

The charge control signal generation circuit 320 may transition the charge control signals SHT<i>/SHTB<i> in response to the source equalizing signal BLEQB<i> and the source switching control signal IOSWB<i>.

The charge control switch 218 may connect the first signal line 401 and the second signal line 402 with each other in accordance with any one SHT<i> of the pair of charge control signals SHT<i>/SHTB<i>.

The charge control switch 218 may include a gate, a source, and a drain. The gate of the charge control switch 218 may receive any one SHT<i> of the pair of charge control signals SHT<i>/SHTB<i>. The source of the charge control switch 218 may be connected to the first signal line 401. The drain of the charge control switch 218 may be connected to the second signal line 402.

Figure 5:
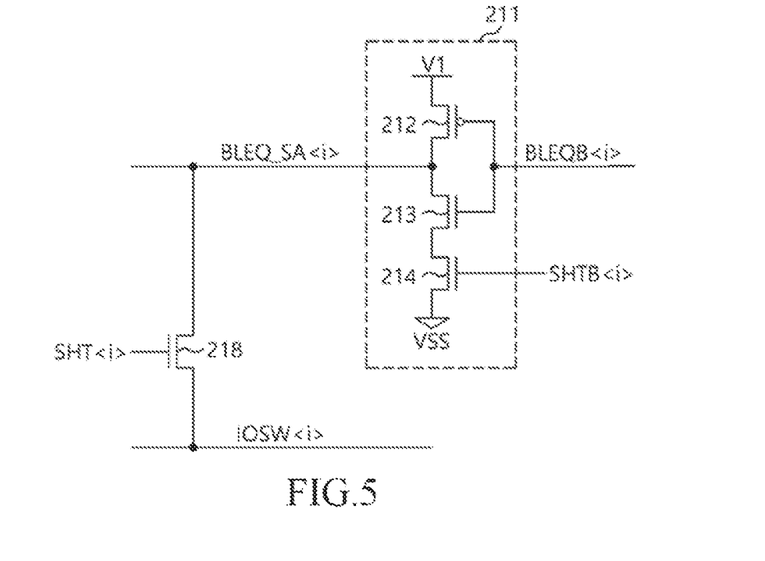
FIG. 5 is a view illustrating a first driver in FIG. 4.

FIG. 5 is a view illustrating the first driver 211 in FIG. 4.

Referring to FIG. 5, the first driver 211 may include a first transistor 212, a second transistor 213, and a third transistor 214.

The first transistor 212 may include a source, a gate, and a drain. The source of the first transistor 212 may receive the first power voltage V1. The gate of the first transistor 212 may receive the source equalizing signal BLEQB<i>. The drain of the first transistor 212 may output the sense amplifier equalizing signal BLEQ_SA<i>.

The second transistor 213 may include a gate, a drain, and a source. The gate of the second transistor 213 may receive the source equalizing signal BLEQB<i>. The drain of the second transistor 213 may be connected to the drain of the first transistor 212.

The third transistor 214 may include a gate, a drain, and a source. The gate of the third transistor 214 may receive any one SHTB<i> of the pair of charge control signals SHT<i>/SHTB<i>. The drain of the third transistor 214 may be connected to the source of the second transistor 213. The source of the third transistor 214 may receive the ground voltage VSS.

Figure 6:
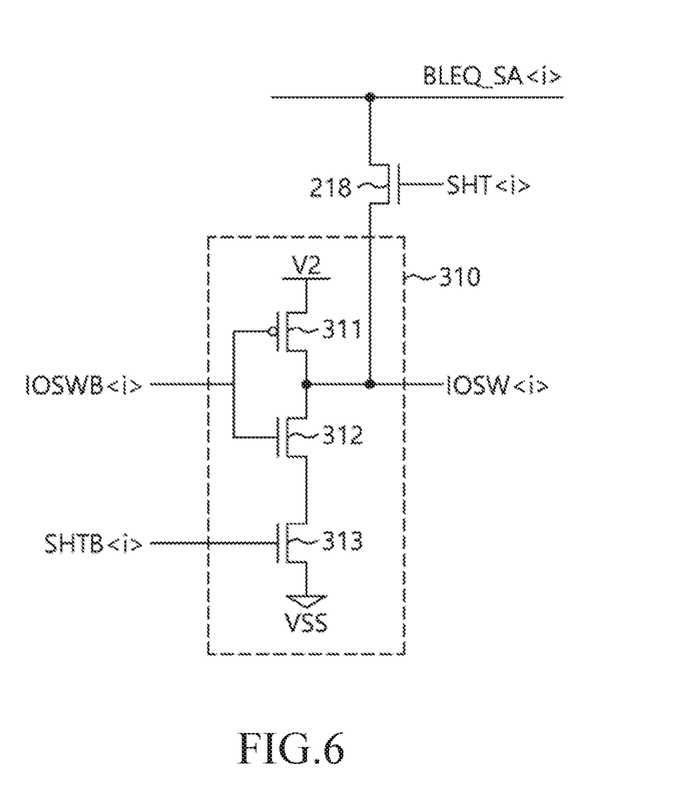
FIG. 6 is a view illustrating a second driver in FIG. 4.

FIG. 6 is a view illustrating the second driver 310 in FIG. 4.

Referring to FIG. 6, the second driver 310 may include a first transistor 311, a second transistor 312, and a third transistor 313.

The first transistor 311 may include a gate, a source, and a drain. The gate of the first transistor 311 may receive the source switching control signal IOSWB<i>. The source of the first transistor 311 may receive the second power voltage V2. The drain of the first transistor 311 may output the data line switching control signal IOSW<i>.

The second transistor 312 may include a gate, a drain, and a source. The gate of the second transistor 312 may be connected to the gate of the first transistor 311. The drain of the second transistor 312 may be connected to the drain of the first transistor 311.

The third transistor 313 may include a gate, a drain, and a source. The gate of the third transistor 313 may receive the charge control signal SHTB<i>. The source of the third transistor 313 may receive the ground voltage VSS. The drain of the third transistor 313 may be connected to the source of the second transistor 312.

Figure 7:
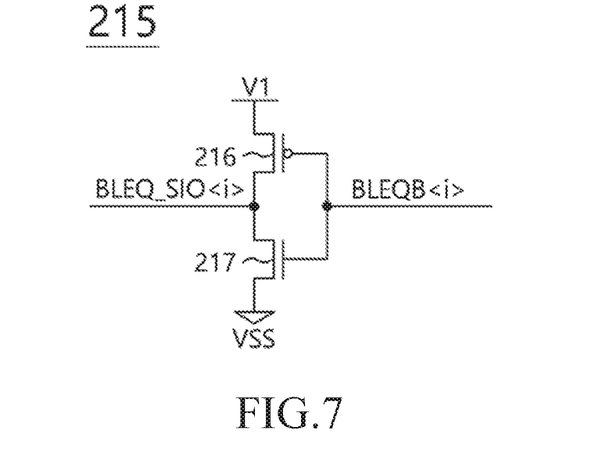
FIG. 7 is a view illustrating a third driver in FIG. 4.

FIG. 7 is a view illustrating the third driver 215 in FIG. 4.

Referring to FIG. 7, the third driver 215 may include a first transistor 216 and a second transistor 217.

The first transistor 216 may include a gate, a source, and a drain. The source of the first transistor 216 may receive the first power voltage V1. The gate of the first transistor 216 may receive the source equalizing signal BLEQB<i>. The drain of the first transistor 216 may output the data line equalizing signal BLEQ_SIO<i>.

The second transistor 217 may include a gate, a drain, and a source. The source of the second transistor 217 may receive the ground voltage VSS. The gate of the second transistor 217 may receive the source equalizing signal BLEQB<i>. The drain of the second transistor 217 may be connected to the drain of the first transistor 216.

Figure 8:
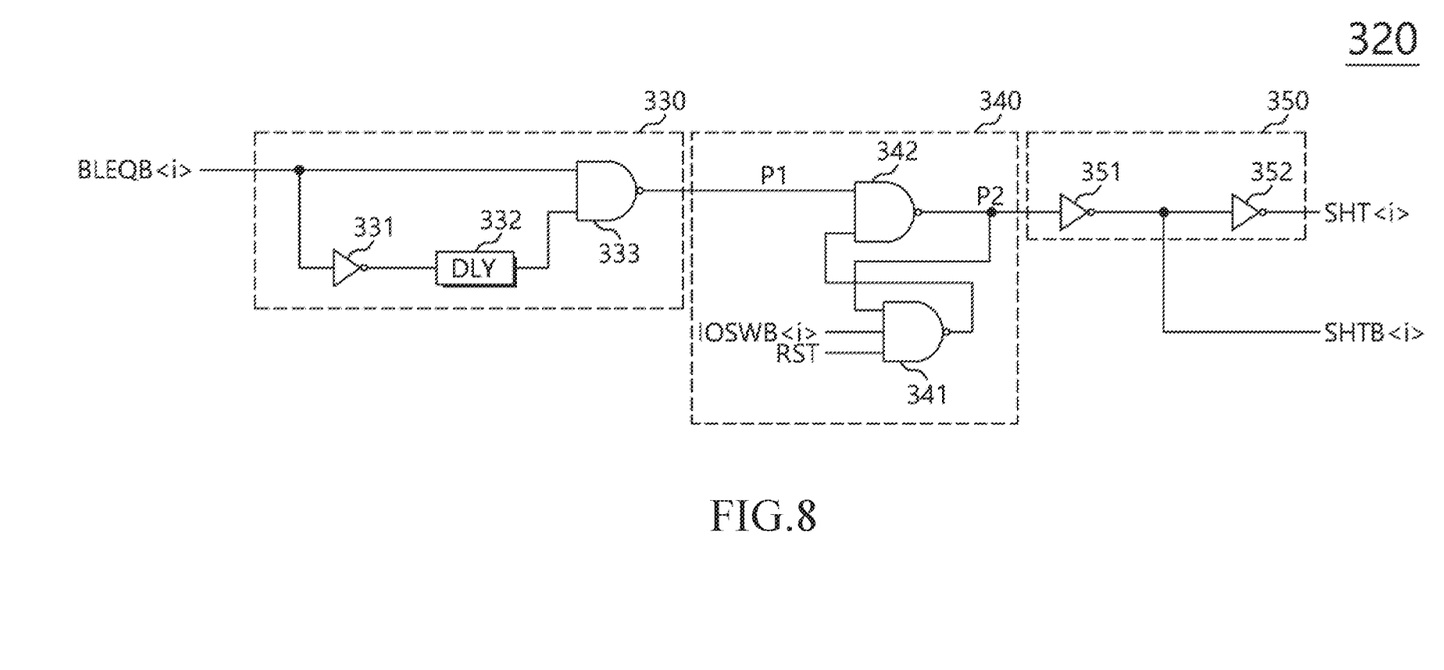
FIG. 8 is a view illustrating a charge control signal generation circuit in FIG. 4.

FIG. 8 is a view illustrating the charge control signal generation circuit 320 in FIG. 4.

Referring to FIG. 8, the charge control signal generation circuit 320 may include a pulse generation circuit 330, an SR latch 340, and a phase separating circuit 350.

The pulse generation circuit 330 may generate a pulse signal P1 in accordance with the source equalizing signal BLEQB<i>.

The pulse generation circuit 320 may include a first logic gate 331, a delay 332, and a second logic gate 333.

The first logic gate 331 may invert the source equalizing signal BLEQB<i>.

The delay 332 may delay an output signal from the first logic gate 331.

The second logic gate 333 may perform a NAND operation of the source equalizing signal BLEQB<i> and an output signal from the delay 332 to generate the pulse signal P1.

The SR latch 340 may transition a preliminary signal P2 to a high level in response to a rising edge of the pulse signal P1. The SR latch 340 may transit the preliminary signal P2 to a low level in response to a falling edge of the source switching control signal IOSWB<i>.

The SR latch 340 may reset the charge control signals SHT<i>/SHTB<i> to the low level or the high level, by transitioning a level of the preliminary signal P2 from the high level to the low level according to the reset signal RST.

The SR latch 340 may include a first logic gate 341 and a second logic gate 342.

The first logic gate 341 may perform a NAND operation of the preliminary signal P2, the data line switching control signal IOSWB<i>, and the reset signal RST.

The second logic gate 342 may perform a NAND operation of an output signal of the first logic gate 341 and the pulse signal P1.

The phase separating circuit 350 may generate the charge control signals SHT<i>/SHTB<i> having opposite phases in accordance with the preliminary signal P2.

The phase separating circuit 350 may include a first logic gate 351 and a second logic gate 352.

The first logic gate 351 may invert the preliminary signal P2 to output any one SHTB<i> of the charge control signals SHT<i>/SHTB<i>.

The second logic gate 352 may invert the charge control signal SHTB<i> to output the charge control signal SHT<i>.

Figure 9:
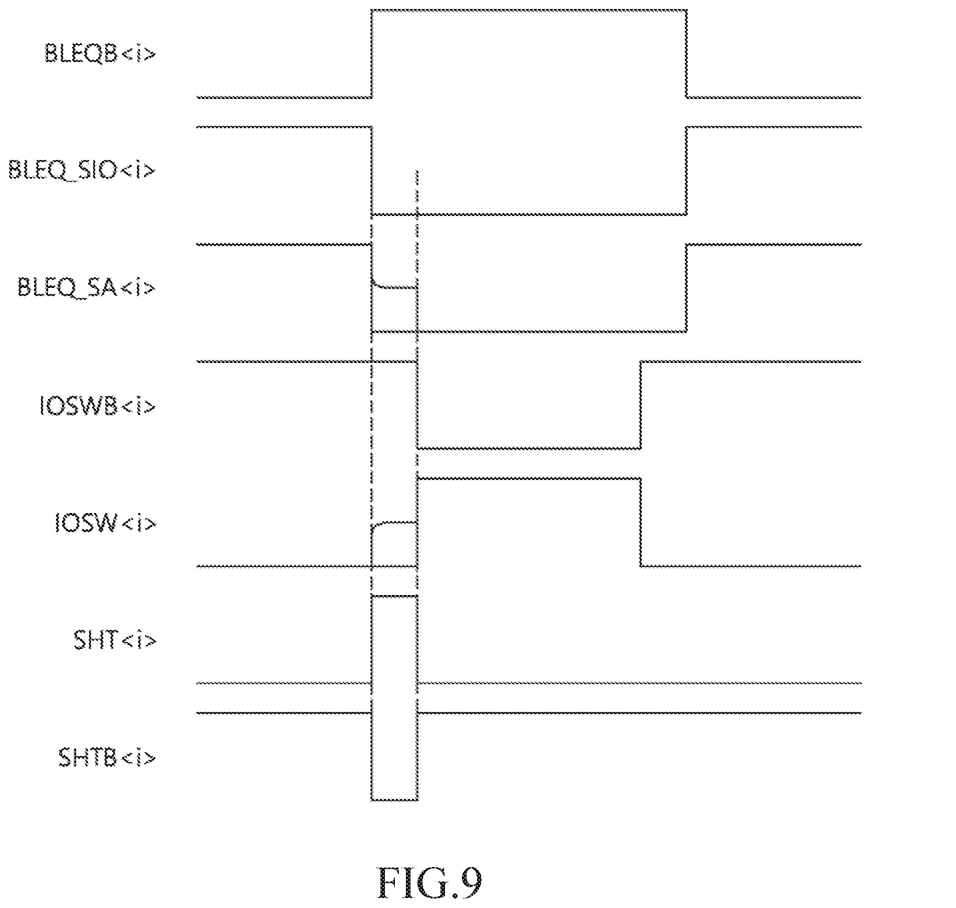
FIG. 9 is a timing chart illustrating an operation of a semiconductor device in accordance with example embodiments.

FIG. 9 is a timing chart illustrating an operation of a semiconductor device in accordance with example embodiments.

In an initial operation of the semiconductor device, the charge control signals SHT<i>/SHTB<i> may be reset to a high level and a low level, respectively, in accordance with the reset signal RST.

In a standby mode of the semiconductor device, the source equalizing signal BLEQB<i> may be a low level. The sense amplifier equalizing signal BLEQ_SA<i> and the data line equalizing signal BLEQ_SIO<i> may be a high level.

The pair of bit lines BL and the BLB and the pair of segment lines SIO and SIOB may be pre-charged to the pre-charge voltage VBLP level in accordance with the high level of the sense amplifier equalizing signal BLEQ_SA<i> and the data line equalizing signal BLEQ_SIO<i>. Because the data line switching control signal IOSW<i> may be a low level, the pair of segment lines SIO and SIOB and the pair of local lines LIO and LIOB may be divided.

In an active mode of the semiconductor device, the source equalizing signal BLEQB<i> may transition to a high level. The sense amplifier equalizing signal BLEQ_SA<i> and the data line equalizing signal BLEQ_SIO<i> may transition to a low level to stop the pre-charging operations of the pair of bit lines BL and BLB and the pair of segment lines SIO and SIOB.

Further, the source equalizing signal BLEQB<i> may transition to the high level so that the charge control signals SHT<i>/SHTB<i> may transition to a high level and a low level, respectively.

Referring to FIG. 5, the first driver 211 may drive the sense amplifier equalizing signal BLEQ_SA<i> as the ground voltage VSS by transitioning the source equalizing signal BLEQB<i> to the high level.

However, by transitioning the source equalizing signal BLEQB<i> to the high level, a transition operation of the sense amplifier equalizing signal BLEQB_SA<i> may be stopped by the charge control signal SHTB<i> transitioned to the low level. Here, the transition operation of the sense amplifier equalizing signal BLEQB_SA<i> may be an operation of changing a voltage level so that the sense amplifier equalizing signal BLEQB_SA<i> has the ground voltage VSS level. That is, the transition operation may be delayed during the low level of the charge control signal SHTB<i>.

Referring to FIG. 6, because the transistor 313 may be turned-off by the charge control signal SHTB<i> transitioned to the low level to block a current path, an operation of the second driver 310 for driving the data line switching control signal IOSW<i> to the ground voltage VSS level in accordance with the high level of the data line switching control signal IOSWB<i> may be stopped during a first time (a high level period of the charge control signal SHT<i>).

Simultaneously, the charge control switch 218 may be turned-on by the charge control signal SHT<i> transitioned to the high level. Thus, the charge sharing between the sense amplifier equalizing signal BLEQ_SA<i> and the data line switching control signal IOSW<i> may be performed during the first time (a high level period of the charge control signal SHT<i>).

The charge in the sense amplifier equalizing signal line BLEQ_SA<i> by the pre-charging may be charged in the data line switching control signal line IOSW<i> by the charge sharing operation. A voltage level of the data line switching control signal IOSW<i> can increase.

After the source equalizing signal BLEQB<i> is transitioned to the high level and a predetermined time has elapsed, the source switching control signal IOSWB<i> may be transitioned to a low level.

The charge control signals SHT<i>/SHTB<i> may be transitioned to a high level and a low level by transitioning the source switching control signal IOSWB<i> to the low level, respectively.

Because the source switching control signal IOSWB<i> may be the low level and the charge control signal SHTB<i> may be the high level, the second driver 310 may drive the data line switching control signal IOSW<i> to have the second power voltage V2 level.

Because the voltage level of the data line switching control signal IOSW<i> has already increased by the charge sharing, a power consumption for driving the data line switching control signal IOSW<i> may be remarkably reduced compared when the ground voltage VSS level of the data line switching control signal IOSW<i> may be driven to the second power voltage V2 level.

The pair of segment lines SIO and SIOB and the pair of local lines LIO and LIOB may be connected with each other by the data line switching control signal IOSW<i> with the high level, to perform the active operation of the semiconductor device such as the read operation, the write operation, etc.

After completing the active operation of the semiconductor device, the pair of segment lines SIO and SIOB and the pair of local lines LIO and LIOB may be disconnected from each other by transitioning the data line switching control signal IOSW<i> to the low level.

The data line switching control signal IOSW<i> may be transitioned to the low level, and after a predetermined time has elapsed, the source equalizing signal BLEQB<i> may be transitioned to the low level. Thus, the sense amplifier equalizing signal BLEQ_SA<i> and the data line equalizing signal BLEQ_SIO<i> may be transitioned to the high level.

The pair of bit lines BL and BLB and the pair of segment lines SIO and SIOB may be pre-charged to the pre-charge voltage VBLP level by the sense amplifier equalizing signal BLEQ_SA<i> with the high level and the data line equalizing signal BLEQ_SIO<i>.

The above described embodiments of the present teachings are intended to illustrate and not to limit the present teachings. Various alternatives and equivalents are possible. The present teachings are not limited by the embodiments described herein. Nor are the present teachings limited to any specific type of semiconductor device. Another additions, subtractions, or modifications are obvious in view of the present disclosure and are intended to fall within the scope of the appended claims.

What is claimed is:

1. A data line switching control circuit comprising:
   a first driver configured to generate a first equalizing signal for pre-charging a first data line according to a source equalizing signal;
   a second driver configured to generate a data line switching control signal for connecting a second data line with a third data line according to a source switching control signal; and
   a charge control switch configured to connect a first signal line with a second signal line during a first level period of a charge control signal,
   wherein the first equalizing signal is transmitted through the first signal line and the data line switching control signal is transmitted through the second signal line.

2. The data line switching control circuit of claim 1, wherein a charge in the first signal line is charged in the second signal line by connecting the first signal line with the second signal line.

3. The data line switching control circuit of claim 1, wherein the first driver is disconnected from a ground voltage terminal by an inverted charge control signal.

4. The data line switching control circuit of claim 1, wherein the second driver is disconnected from a ground voltage terminal by an inverted charge control signal.

5. The data line switching control circuit of claim 1, further comprising a charge control signal generation circuit configured to generate the charge control signal in accordance with the source equalizing signal and the source switching control signal.

6. The data line switching control circuit of claim 5, wherein the charge control signal generation circuit comprises:
   a pulse generation circuit configured to generate a pulse signal according to the source equalizing signal;
   an SR latch configured to transition a preliminary signal to a first voltage level according to a rising edge of the pulse signal and to transition the preliminary signal to a second voltage level according to a falling edge of the source switching control signal; and
   a phase separating circuit configured to generate the charge control signal and an inverted charge control signal according to the preliminary signal.

7. The data line switching control circuit of claim 1, wherein the first data line includes a bit line, the second data line includes a segment line, and the third data line includes a local line.

8. A semiconductor device comprising:
   a memory cell array including first, second, and third data lines;
   a first pre-charge circuit configured to pre-charge the first data line according to a first equalizing signal with a first voltage level; and
   a data line switching control circuit configured to disconnect the second data line from the third data line according to data line switching control signal with a second voltage level in a standby mode of the semiconductor device, to perform charge sharing between a first signal line and a second signal line only for a partial time of an active mode of the semiconductor device, and to drive the data line switching control signal to the first voltage level, wherein the first equalizing signal is transmitted through the first signal line and the data line switching control signal is transmitted through the second signal line, and wherein the first equalizing signal and the data line switching control signal are independent of each other and generated by different source signals.

9. The semiconductor device of claim 8, further comprising a second pre-charge circuit configured to pre-charge the second data line according to a second equalizing signal.

10. The semiconductor device of claim 9, wherein a signal line for transmitting the first equalizing signal is disconnected from a signal line for transmitting the second equalizing signal.

11. The semiconductor device of claim 8, wherein the data line switching control circuit comprises:
   a first driver configured to generate the first equalizing signal through the first signal line according to a source equalizing signal;
   a second driver configured to generate the data line switching control signal through the second signal line according to a source switching control signal; and
   a charge control switch configured to connect the first signal line with the second signal line according to a charge control signal.

12. The semiconductor device of claim 11, wherein the first driver is disconnected from a ground voltage terminal by an inverted charge control signal.

13. The semiconductor device of claim 11, wherein the second driver is disconnected from a ground voltage terminal by an inverted charge control signal.

14. The semiconductor device of claim 11, further comprising a charge control signal generation circuit configured to generate the charge control signal based on the source equalizing signal and the source switching control signal.

15. The semiconductor device of claim 14, wherein the charge control signal generation circuit comprises:
   a pulse generation circuit configured to generate a pulse signal according to the source equalizing signal;
   an SR latch configured to transition a preliminary signal to a first voltage level according to a rising edge of the pulse signal and to transition the preliminary signal to a second voltage level according to a falling edge of the source switching control signal; and
   a phase separating circuit configured to generate the charge control signal and an inverted charge control signal according to the preliminary signal.

16. The semiconductor device of claim 11, wherein the first driver is included in a sub hole region of the memory cell array.

17. The semiconductor device of claim 16, further comprising a peripheral circuit, wherein the second driver is included in a row decoder of the peripheral circuit.

18. The semiconductor device of claim 11, further comprising a data line switching circuit configured to connect the second data line with the third data line when the data line switching control signal has the first voltage level and to disconnect the second data line from the third data line when the data line switching control signal has the second voltage level.

19. The semiconductor device of claim 8, wherein the first data line includes a bit line, the second data line includes a segment line, and the third data line includes a local line.

* * * * *